(12) United States Patent
Kwen et al.

(10) Patent No.: US 9,780,305 B2
(45) Date of Patent: Oct. 3, 2017

(54) MASK FRAME ASSEMBLY FOR THIN FILM DEPOSITION

(71) Applicant: SAMSUNG DISPLAY CO., LTD., Yongin, Gyeonggi-Do (KR)

(72) Inventors: Hanul Kwen, Yongin (KR); Junghoon Kim, Yongin (KR); Hanyoung Kim, Yongin (KR); Younghoon Roh, Yongin (KR); Wooyoung Jung, Yongin (KR); Cheolgyu Jeong, Yongin (KR); Pilseon Ji, Yongin (KR); Jaemin Hong, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 80 days.

(21) Appl. No.: 14/576,394

(22) Filed: Dec. 19, 2014

(65) Prior Publication Data
US 2016/0005970 A1    Jan. 7, 2016

(30) Foreign Application Priority Data

Jul. 4, 2014   (KR) .................. 10-2014-0083896

(51) Int. Cl.
| | | |
|---|---|---|
| C23C 14/04 | (2006.01) | |
| C23C 16/04 | (2006.01) | |
| H01L 51/00 | (2006.01) | |
| H01L 51/56 | (2006.01) | |

(52) U.S. Cl.
CPC ........ *H01L 51/0011* (2013.01); *C23C 14/042* (2013.01); *C23C 16/042* (2013.01); *H01L 51/56* (2013.01)

(58) Field of Classification Search
None
See application file for complete search history.

(56) References Cited

U.S. PATENT DOCUMENTS

| | | | | |
|---|---|---|---|---|
| 2007/0157879 | A1* | 7/2007 | Yotsuya | C23C 14/042 118/505 |
| 2010/0192856 | A1* | 8/2010 | Sung | C23C 14/042 118/504 |
| 2011/0139069 | A1* | 6/2011 | Ahn | C23C 14/042 118/504 |
| 2011/0146573 | A1* | 6/2011 | Park | C23C 14/042 118/504 |
| 2012/0174862 | A1* | 7/2012 | Lee | C23C 14/042 118/504 |
| 2012/0266813 | A1 | 10/2012 | Hong | |

(Continued)

FOREIGN PATENT DOCUMENTS

| | | |
|---|---|---|
| KR | 10-2009-0059225 A | 6/2009 |
| KR | 10-2010-0000129 A | 1/2010 |

(Continued)

*Primary Examiner* — Binu Thomas
(74) *Attorney, Agent, or Firm* — Lee & Morse P.C.

(57) ABSTRACT

Provided is a mask frame assembly for thin film deposition. The mask frame assembly includes a mask frame having an opening surrounded by the mask frame; and a support extending across the opening to support a mask on the mask frame. The support includes a support body, a plurality of ribs in the support body, and one or more patterned portions in spaces between the plurality of ribs, the one or more patterned portions having a different thickness than the ribs.

20 Claims, 9 Drawing Sheets

(56) References Cited

U.S. PATENT DOCUMENTS

| | | | |
|---|---|---|---|
| 2012/0279444 A1 | 11/2012 | Hong | |
| 2012/0325143 A1* | 12/2012 | Kang | C23C 14/042 118/504 |
| 2015/0159267 A1* | 6/2015 | Ochi | C23C 14/042 118/505 |

FOREIGN PATENT DOCUMENTS

| | | | |
|---|---|---|---|
| KR | 10-2012-0120703 A | 11/2012 | |
| KR | 10-2012-0125035 A | 11/2012 | |
| WO | WO2014010284 a | * | 1/2014 |

\* cited by examiner

MASK FRAME ASSEMBLY FOR THIN FILM DEPOSITION

CROSS-REFERENCE TO RELATED APPLICATION

Korean Patent Application No. 10-2014-0083896, filed on Jul. 4, 2014, in the Korean Intellectual Property Office, and entitled: "Mask Frame Assembly for Thin Film Deposition," is incorporated by reference herein in its entirety.

BACKGROUND

1. Field

One or more embodiments relate to mask frame assemblies for thin film deposition.

2. Description of the Related Art

Display apparatuses, such as organic light-emitting display apparatuses, may be used in mobile apparatuses, such as smart phones, tablet personal computers, laptop computers, digital cameras, camcorders, or portable information terminals, and electronic/electric products, such as ultrathin televisions.

Light-emitting layers formed in display apparatuses may be fabricated in various ways. Photolithography is a method of coating a region on a substrate with a photoresist and wet-etching the resulting structure. Deposition is a method of disposing a fine metal mask (FMM) having the same pattern as a thin film formed on a substrate and depositing a raw material of the thin film on the substrate.

SUMMARY

Embodiments may be realized by providing a mask frame assembly for thin film deposition, the mask frame assembly including a mask frame having an opening surrounded by the mask frame; and a support extending across the opening to support a mask on the mask frame. The support includes a support body, a plurality of ribs in the support body, and one or more patterned portions in spaces between the plurality of ribs, the one or more patterned portions having a different thickness than the ribs.

The mask may include one or more mask sticks extending across the opening in a first direction, and the support may extend in a second direction intersecting the one or more mask sticks.

The support may be between the mask and the mask frame, and both end portions of the support body may be welded to the mask frame.

A portion of the support body may have a smaller thickness than the plurality of ribs.

The one or more patterned portions may be between a pair of adjacent ribs along the first direction and may be etched regions that extend in the support body along the second direction.

The etched regions may be etched toward a bottom surface of the support body from a top surface of the support body that faces the mask.

The one or more patterned portions may be half-etched regions.

The one or more patterned portions may include a first patterned portion having a first etched region at a center of the support body along the second direction and a second patterned portion having a second etched region at both edges of the support body along the first direction.

The first etched region may extend to the support body along the second direction, and a plurality of protrusions may be in the first etched region.

In a portion of the support body including the plurality of protrusions, a thickness of the support body may be equal to a thickness of the plurality of ribs.

The second patterned portion may be between a pair of adjacent ribs along the first direction and may extend to the support body along the second direction.

The first patterned portion having the first etched region and the second patterned portion having the second etched region may be etched toward a bottom surface of the support body from a top surface of the support body that faces the mask.

The one or more patterned portions may pass through the support body.

The one or more patterned portions may be between a pair of adjacent ribs along the first direction and may be through holes that extend in the support body along the second direction and pass through the support body.

A bottom surface of the mask may directly contact a top surface of the plurality of ribs.

A plurality of deposition pattern portions may be in the one or more mask sticks along the first direction to be spaced apart from each other, and a mask rib may be between adjacent deposition pattern portions to connect the adjacent deposition pattern portions to each other.

The support may be a position corresponding to the mask rib.

The first direction may be a direction in which a tensile force to weld both end portions of the mask to the mask frame is applied to the mask, and the second direction may be a direction in which a tensile force to weld both end portions of the support to the mask frame is applied to the support.

The first direction may be a width direction of the support, and the second direction may be a longitudinal direction of the support.

The mask frame may include a plurality of first frames facing each other in a first direction and a plurality of second frames facing each other in a second direction, and the plurality of first frames and the plurality of second frames may be connected to each other to surround the opening.

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. As used herein, expressions such as "at least one of," when preceding a list of elements, modify the entire list of elements and do not modify the individual elements of the list.

Although terms such as "first" and "second" may be used herein to describe various elements or components, these elements or components should not be limited by these terms. These terms are only used to distinguish one element or component from another element or component.

The terminology used herein is for the purpose of describing particular embodiments only and is not intended to be limiting. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, mask frame assemblies for thin film deposition according to embodiments will be described in detail with reference to the accompanying drawings. In the following description, like reference numerals denote like elements, and a redundant description thereof will be omitted.

Figure 1:
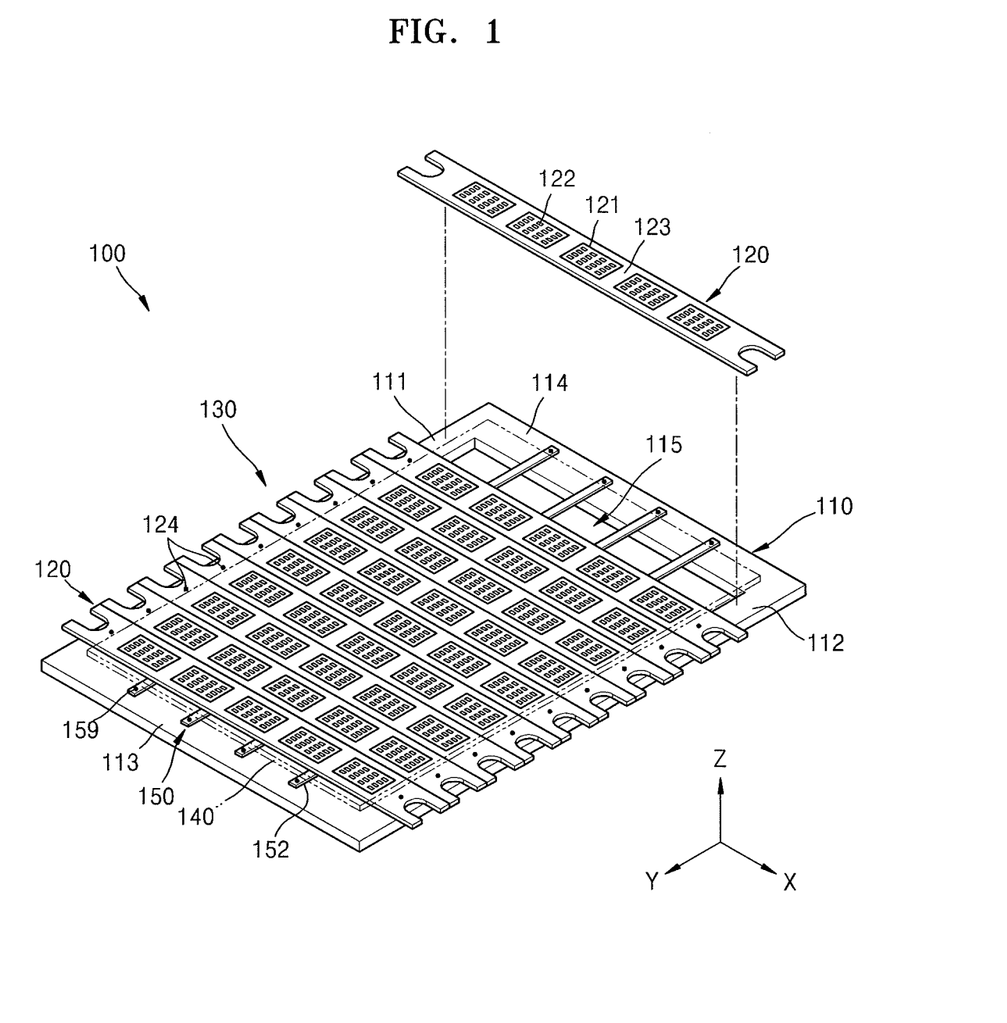
FIG. 1 illustrates a perspective view of a mask frame assembly for thin film deposition according to an embodiment.

FIG. 1 illustrates a perspective view of a mask frame assembly 100 for thin film deposition according to an embodiment.

Referring to FIG. 1, the mask frame assembly 100 may include a mask frame 110 and a support 150 to support a mask 130 installed on the mask frame 110.

An opening 115 may be formed in the mask frame 110. The opening 115 may be surrounded by a plurality of frames 111 to 114. The plurality of frames 111 to 114 may be connected to each other.

The plurality of frames 111 to 114 may include a first frame 111 and a second frame 112 that face each other in an X direction and are arrayed in a Y direction, and a third frame 113 and a fourth frame 114 that face each other in the Y direction and are arrayed in the X direction. The first frame 111, the second frame 112, the third frame 113, and the fourth frame 114 may be rectangular frames that are connected to each other.

The mask frame 110 may be formed of a material having low deformation during welding of the mask 130, for example, a metal having high rigidity.

The mask 130 may be attached onto the mask frame 110. For highly accurate patterning, a close adhesion between the mask 130 and a deposition substrate 140 disposed on the mask may be increased to reduce shadows. The mask 130 may be formed in the shape of a thin plate. For example, the mask 130 may include stainless steel, Invar, nickel (Ni), cobalt (Co), a Ni alloy, or a Ni—Co alloy.

A display size may be increased, and the size of the mask 130 may also be increased. The mask 130 may include a plurality of mask sticks 120, and the mask 130 may be prevented from sinking, for example, due to the weight of the mask 130.

For convenience in fabrication, a large-sized substrate may be used to fabricate a plurality of small-sized display apparatuses, and the mask sticks 120 may be used.

A plurality of deposition pattern portions 121 may be formed in each of the mask sticks 120. The deposition pattern portions 121 may be arranged to be spaced apart from each other by a predetermined distance in a longitudinal direction of the mask sticks 120.

A plurality of slits 122 may be formed in the deposition pattern portions 121. The deposition pattern portions 121 may include dot-shaped slits or strip-shaped slits. A mask rib 123 may be formed between the deposition pattern portions 121 that are adjacent to each other. The mask rib 123 may connect the adjacent deposition pattern portions 121 to each other. The mask rib 123 may be shorter than the deposition pattern portion 121 in the longitudinal direction of the mask stick 120.

In the case of a large-sized display apparatus, a plurality of mask sticks 120 may function as one mask. In the case of a small-sized display apparatus, each deposition pattern portion 121 may correspond to a single display apparatus.

In an embodiment, exemplary stripe-shaped mask sticks 120 are described. The mask sticks 120 may have any size, shape, or structure as long as the width of the mask 130 is smaller than the length of the mask 130 in a tensile direction (X direction).

A plurality of mask sticks 120 may be arranged in a direction (Y direction) intersecting the tensile direction (X direction). The mask stick 120 extends in a direction perpendicular to the first frame 111 and the second frame 112, and both end portions of the mask stick 120 may be fixed to the first frame 111 and the second frame 112 with a tensile force applied thereto.

Both end portions of the mask stick 120 may be fixed to the first frame 111 and the second frame 112 by spot welding to form welding points 124. The mask sticks 120 may be arranged successively in a direction (Y direction) and parallel to the third frame 113 and the fourth frame 114 to cover the opening 115.

The support 150 may be installed between the mask frame 110 and the mask stick 120. The support 150 may prevent the mask stick 120 from sinking. The support 150 may be disposed in a direction (Y direction) intersecting the mask stick 120. In particular, the support 150 may include a plurality of ribs 152 extending in the Y direction and spaced apart in the X-direction.

The support 150 may extend in the Y direction across the opening 115. End portions of the ribs 152 may be fixed to the third frame 113 and the fourth frame 114 by spot welding to form welding points 159. The support 150 may be fixed to the third frame 113 and the fourth frame 114 with a tensile force applied thereto.

The ribs 152 may be disposed at a position corresponding to the mask rib 123 of the mask stick 120. A top surface of the ribs 152 may contact, e.g., directly contact, a bottom surface of the mask rib 123 that is adjacent to another mask rib in the Y direction. In other words, deposition pattern portions 121 of the mask sticks 120 may be in spaces between the ribs 152.

In a process of fabricating the mask frame assembly 100 for thin film deposition, a foreign substance may adhere to the support 150, the close adhesion of the mask stick 120 to the support 150 may be unsuccessful, and the position of the deposition substrate 140 installed on the mask stick 120 may be changed.

In the present embodiment, a space for removing the foreign substance may be formed in the support 150.

Figure 2A:
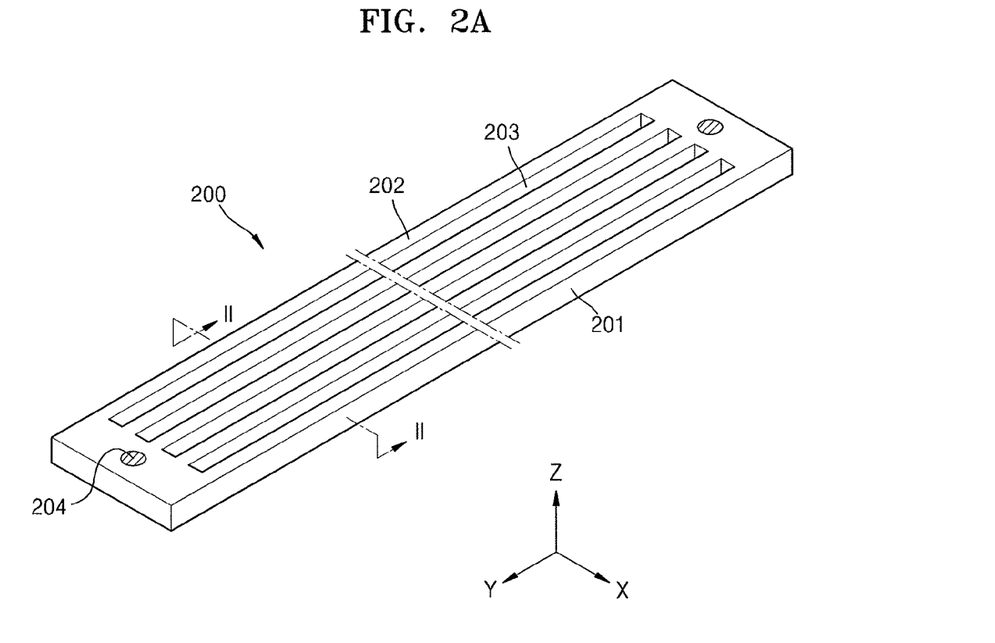
FIG. 2A illustrates a perspective view of a support according to an embodiment.
Figure 2B:
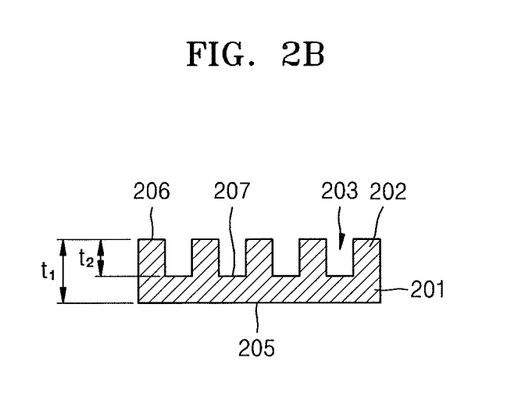
FIG. 2B illustrates a cross-sectional view taken along a line II-II of FIG. 2A.

FIG. 2A illustrates a perspective view of a support 200 according to an embodiment, and FIG. 2B illustrates a cross-sectional view taken along a line II-II of FIG. 2A.

Referring to FIGS. 2A and 2B, the support 200 may include a support body 201, a plurality of ribs 202 formed in the support body 201, and one or more patterned portions 203 formed with, e.g., in, spaces between the plurality of ribs 202 that are adjacent to each other.

The support body 201 may have the shape of a stick extending in the Y direction. Welding points 204 welded to the mask frame may be formed at both end portions of the support body 201. The welding points 204 may be formed at both end portions of the support body 201 or may be formed at intersections between the support 200 and the mask stick 120.

A plurality of ribs 202 may be formed in the support body 201.

The ribs 202 may extend in the Y direction and may be spaced apart from each other by a predetermined distance in the X direction. A patterned portion 203 may be formed between the ribs 202 that are adjacent to each other. The patterned portion 203 may have a different thickness from the rib 202.

The patterned portion 203 may be formed such that a portion of the support body 201 has a smaller thickness than the rib 202. In an embodiment, the patterned portion 203 may be formed by etching, e.g., half etching.

The rib 202 may have a first thickness $t_1$. The patterned portion 203 may have a second thickness $t_2$. Since the patterned portion 203 may be formed by etching, the thickness $t_2$ of the patterned portion 203 may be smaller than the thickness $t_1$ of the rib 202. In an embodiment, the thickness $t_2$ of the patterned portion 203 may be half of the thickness $t_1$ of the rib 202.

A plurality of patterned portions 203 may be formed between adjacent ribs 202 along a width direction (X direction) of the support body 201. The patterned portions 203 may extend in the support body 201 along a longitudinal direction (Y direction) of the support body 201.

The support 200 may have a first surface 205 that is a bottom surface of the support body 201, a second surface 206 that is a top surface of the support body 201, and a third surface 207 that is a bottom surface of a portion where the patterned portion 203 is formed.

The second surface 206 may contact, e.g., directly contact, a bottom surface of the mask rib 123 of the mask stick 120 (see FIG. 1). The half-etched third surface 207 may have a predetermined depth from the second surface 206 of the support body 201 that faces the mask 120 to the first surface 205 of the support body 201.

The half-etched patterned portion 203 may be formed along a longitudinal direction (Y direction) of the support 200. A foreign substance may adhere to the second surface 206 of the support body 201, the foreign substance may be removed in a cleaning process by being moved from the second surface 206 to the space of the patterned portion 203, and the close adhesion between the support 200 and the mask stick 120 may be increased.

Figure 3A:
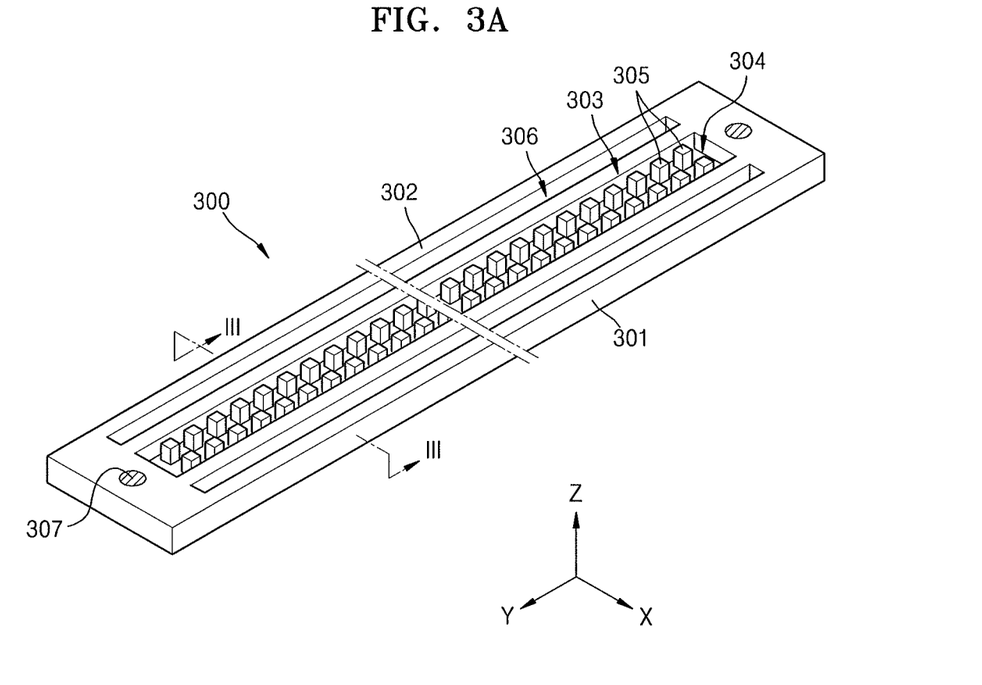
FIG. 3A illustrates a perspective view of a support according to another embodiment.
Figure 3B:
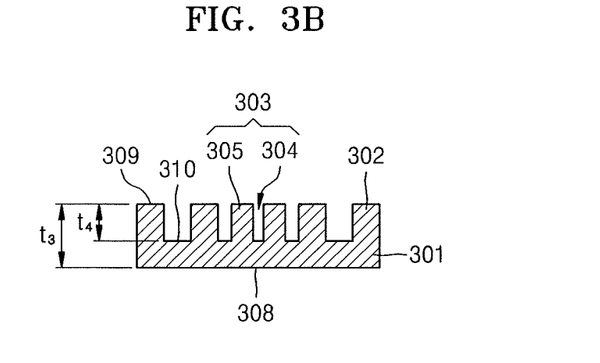
FIG. 3B illustrates a cross-sectional view taken along a line of FIG. 3A.

FIG. 3A illustrates a perspective view of a support 300 according to another embodiment, and FIG. 3B illustrates a cross-sectional view taken along a line of FIG. 3A.

Referring to FIGS. 3A and 3B, the support 300 may include a support body 301, a plurality of ribs 302 formed in the support body 301, and one or more patterned portions. For example, a first patterned portion 303 and a second patterned portion 306 may be formed with spaces between the plurality of ribs 302 that are adjacent to each other.

The support body 301 may have the shape of a stick extending in the Y direction. Welding points 307 welded to the mask frame may be formed at both end portions of the support body 301. The support body 301 may be welded with a tensile force applied thereto.

A plurality of ribs 302 may be formed in the support body 301. The ribs 302 may extend in the support body 301 in the Y direction and may be spaced apart from each other by a predetermined distance in the X direction.

The patterned portions may include the first patterned portion 303 at a center of the support body 301 along a longitudinal direction (Y direction) of the support body 301, and the second patterned portion 306 at both edges of the support body 301 with respect to a width direction (X direction) of the support body 301. Both the first patterned portion 303 and the second patterned portion 306 may have a thickness different than that of the rib 302.

The first patterned portion 303 may include a first half-etched region 304 that is formed in the support body 301 along the Y direction. A plurality of protrusions 305 may be formed in the first half-etched region 304. The protrusions 305 may be spaced apart from each other by a predetermined distance in the longitudinal direction (Y direction) of the support body 301. The protrusions 305 may have the shape of, for example, a rectangular parallelepiped.

The rib 302 may have a third thickness $t_3$. The first half-etched region 304 may have a fourth thickness $t_4$. The thickness $t_4$ of the first half-etched region 304 may be smaller than the thickness $t_3$ of the rib 302. In an embodiment, the thickness $t_4$ may be the half of the third thickness $t_3$. The thickness $t_3$ of the rib 302 may be equal the thickness of a portion of the support body 301 where the protrusions 305 are formed.

The support 300 may have a first surface 308 that is a bottom surface of the support body 301, a second surface 309 that is a top surface of the support body 301, and a third surface 310 that is an intermediate surface on which the protrusions 305 are formed. The second surface 309 may contact, e.g., directly contact, a bottom surface of the mask rib 123 of the mask stick 120 (see FIG. 1).

The second patterned portion 306 may be a second half-etched region that is formed along the longitudinal direction (Y direction) of the support body 301. The second patterned portion 306 may extend in the support body 301. The second patterned portion 306 may be arranged between a pair of adjacent ribs 302.

The first patterned portion 303 may include the first half-etched region 304 and the protrusions 305. The protrusions 305 have a predetermined depth from the second surface 309 of the support body 301 that faces the mask 120 to the first surface 308 of the support body 301 (see FIG. 3B), e.g., protrude from the first half-etched region 304 and level with the second surface 309.

Since a plurality of first patterned portions 303 and second patterned portions 306, both of which may be half-etched, are respectively formed at a center and at both edges of the support body 301 along the longitudinal direction (Y direction) of the support 300, a foreign substance adhered to the second surface 309 may be removed via a half-etched space during a cleaning process.

Figure 4A:
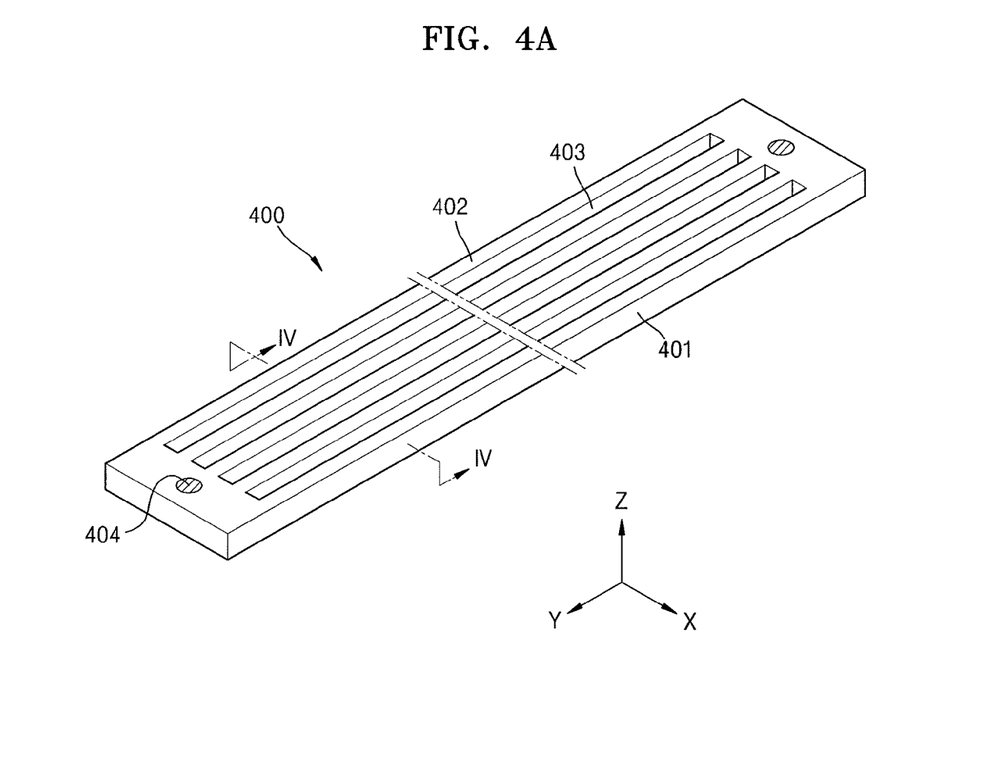
FIG. 4A illustrates a perspective view of a support according to another embodiment.
Figure 4B:
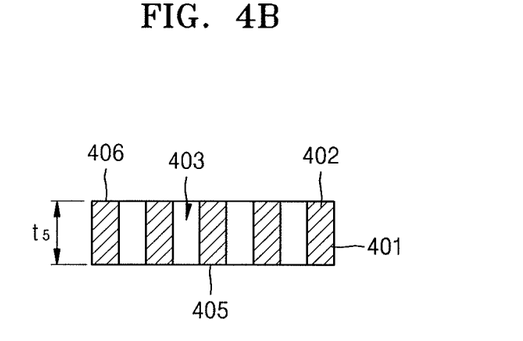
FIG. 4B illustrates a cross-sectional view taken along a line IV-IV of FIG. 4A.

FIG. 4A illustrates a perspective view of a support 400 according to another embodiment, and FIG. 4B illustrates a cross-sectional view taken along a line IV-IV of FIG. 4A.

Referring to FIGS. 4A and 4B, the support 400 may include a support body 401, a plurality of ribs 401 formed in the support body 402, and one or more patterned portions 403 formed with spaces between the plurality of ribs 402 that are adjacent to each other.

The support body 401 may have the shape of a stick extending in the Y direction. Welding points 404 welded to the mask frame may be formed at both end portions of the support body 401. The support body 401 may be welded with a tensile force applied thereto in a longitudinal direction.

A plurality of ribs 402 may be formed in the support body 401. The ribs 402 may extend in the support body 401 in the Y direction and may be spaced apart from each other by a predetermined distance in the X direction.

The support 400 may have a first surface 405 that is a bottom surface of the support body 401 and a second surface 406 that is a top surface of the support body 401. The second surface 406 may contact, e.g., directly contact, a bottom surface of the mask rib 123 of the mask stick 120 (see FIG. 1).

The patterned portions 403 may be formed along a longitudinal direction (Y direction) of the support body 401 and pass through the support body 401. The patterned portions 403 may be through holes that extend in the support body 401 in the Y direction and pass through the support body 401. One or more patterned portions 403 may be arranged between a pair of adjacent ribs 402 along the X direction.

Since patterned portions 403 may be through hole-shaped and formed along the longitudinal direction (Y direction) of the support 400, a foreign substance adhered to the second surface 406 may be removed via the pattern portions 403 during a cleaning process.

Figure 5:
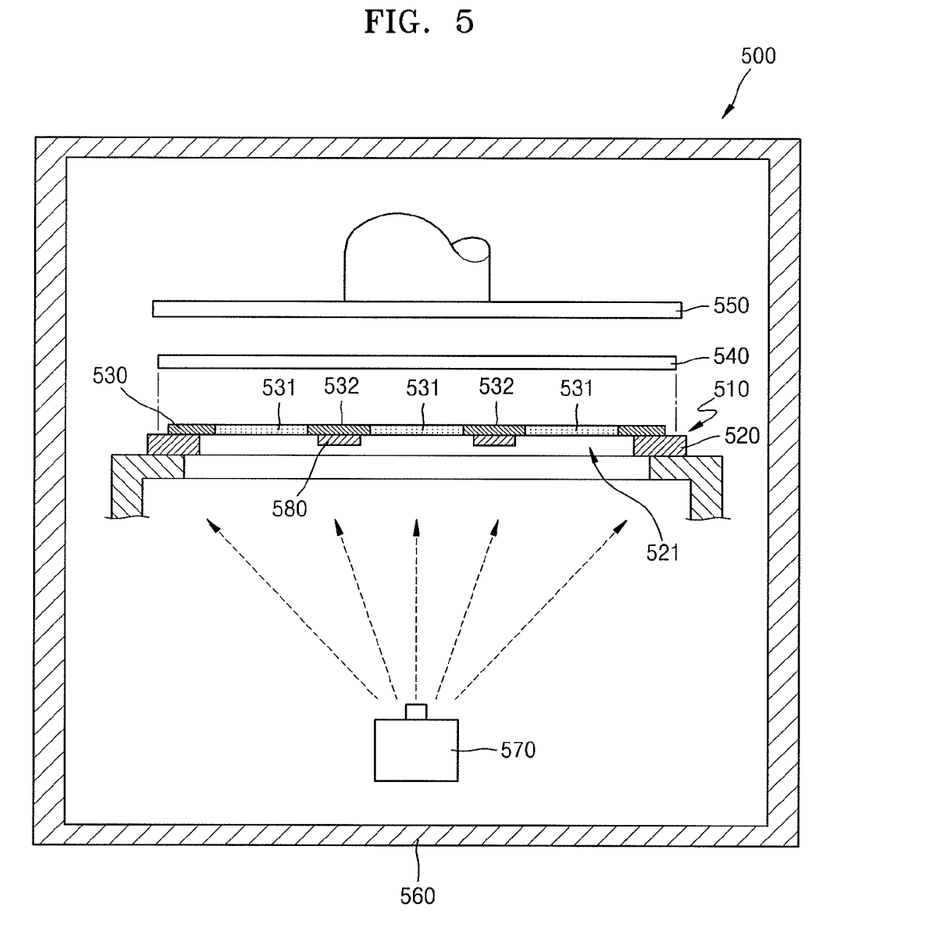
FIG. 5 illustrates a configuration diagram of depositing a thin film by using a mask frame assembly for thin film deposition according to an embodiment.

FIG. 5 illustrates a configuration diagram of depositing a thin film by using a mask frame assembly 500 for thin film deposition according to an embodiment.

In the present embodiment, an exemplary organic light-emitting display apparatus is described. In other embodiments, the display apparatus may be any display apparatus that displays an image when a voltage is applied thereto, for example, a liquid crystal display (LCD) apparatus, a field emission display (FED) apparatus, or an electronic paper display (EPD) apparatus.

Referring to FIG. 5, the mask frame assembly 500 for thin film deposition is provided with a vacuum chamber 560 that is used to deposit an organic emission layer of an organic light-emitting display apparatus.

A deposition source 570 may be disposed at a lower portion in the vacuum chamber 560. A mask frame assembly 510 may be provided above the deposition source 570. A mask 530 may be installed on a mask frame 520. The mask 530 may include a plurality of deposition pattern portions 531 and a mask rib 532 that is formed between adjacent ones of the deposition pattern portions 531. A deposition substrate 540 may be disposed on the mask 530. A magnet 550 may be further provided above the deposition substrate 540 to generate a magnetic force so that the mask 530 may adhere closely to the deposition substrate 540.

A support 580 may be installed on a bottom surface of the mask 530, and may prevent the mask 530 from sinking. The support 580 may be disposed at a position corresponding to the mask rib 532 of the mask 530.

A deposition material may be sprayed onto the mask 530 from the deposition source 570, and the deposition material may be deposited in a desired pattern on one surface of the deposition substrate 540 based on the deposition pattern portions 531 formed on the mask 540.

To complete the deposition pattern, the mask frame assembly 500 for thin film deposition may be used in a cleaning process. In the cleaning process, foreign substances adhered to the support 580 may be discharged through the above-described patterned portions formed in the support 580.

Figure 6:
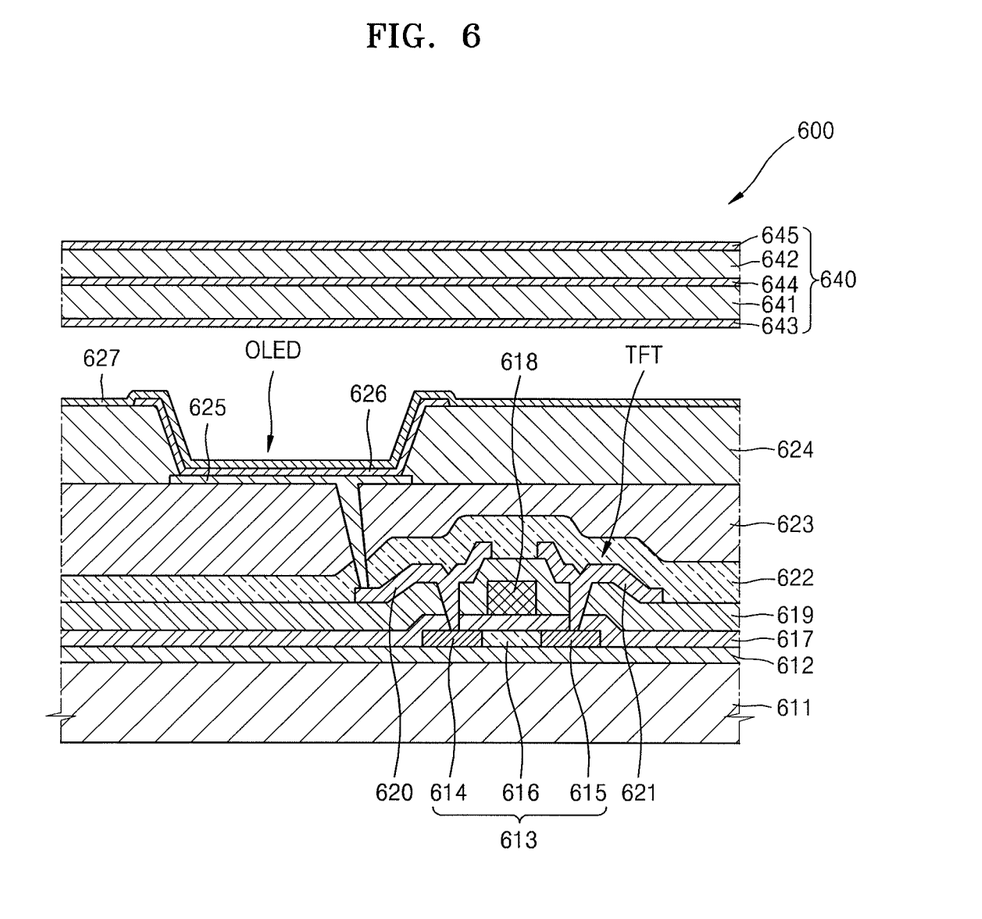
FIG. 6 illustrates a cross-sectional view of a subpixel of an organic light-emitting display apparatus that may be deposited by using a mask frame assembly for thin film deposition according to an embodiment.

FIG. 6 illustrates a cross-sectional view of a subpixel of an organic light-emitting display apparatus 600 that may be deposited by using a mask frame assembly for thin film deposition according to an embodiment.

The subpixel may include at least one thin film transistor TFT and an organic light-emitting device (OLED). The one or more thin film transistors TFT may not necessarily have a structure as shown in FIG. 6, and the number and structure thereof may vary.

Referring to FIG. 6, a display substrate 611 may be provided in the organic light-emitting display apparatus 600. The display substrate 611 may include a flexible insulating material. For example, the display substrate 611 may be a glass substrate.

In an embodiment, the display substrate 611 may be formed of a polymer material such as polyimide (PI), polycarbonate (PC), polyethersulphone (PES), polyethylene terephthalate (PET), polyethylene naphthalate (PEN), polyarylate (PAR), or fiber glass reinforced plastic (FRP).

The display substrate 611 may be transparent, semitransparent, or opaque.

A barrier layer 612 may be formed on the display substrate 611. The barrier layer 612 may cover an entire top surface of the display substrate 611.

The barrier layer 612 may include an inorganic layer or an organic layer.

For example, the barrier layer 612 may be formed of at least one selected from inorganic materials, such as a silicon oxide ($SiO_x$), a silicon nitride ($SiN_x$), a silicon oxynitride (SiON), and an aluminum nitride (AlON), or organic materials, such as acryl, polyimide, and polyester.

The barrier layer 612 may be a single layer or formed of multiple layers.

The barrier layer 612 may block oxygen and moisture, prevent diffusion of moisture or impurities from the display substrate 611, and planarize the display substrate 611.

A thin film transistor TFT may be formed on the barrier layer 612. In the present embodiment, a top gate type thin film transistor is provided as the thin film transistor TFT. In other embodiments, other types of thin film transistors such as a bottom gate type thin film transistors may be provided as the thin film transistor TFT.

A semiconductor active layer 613 may be formed on the barrier layer 612. In the semiconductor active layer 613, a source region 614 and a drain region 615 may be formed by doping N-type or P-type dopant ions. A region between the source region 614 and the drain region 615 is a channel region 616 that is not doped.

The semiconductor active layer 613 may include an inorganic semiconductor such as amorphous silicon or polysilicon semiconductor, or an organic semiconductor. In an embodiment, the semiconductor active layer 613 may be formed of an oxide semiconductor. For example, the oxide semiconductor may include an oxide of a material selected from Group 4, 12, 13, or 14 metal elements, such as zinc (Zn), indium (In), gallium (Ga), tin (Sn), cadmium (Cd), germanium (Ge), hafnium (Hf), and combinations thereof.

A gate insulating layer 617 may be deposited on the semiconductor active layer 613. The gate insulating layer 617 may include an inorganic material such as a metal oxide, a silicon oxide, or a silicon nitride. The gate insulating layer 617 may be a single layer or formed of multiple layers.

A gate electrode 618 may be formed in a predetermined region on the gate insulating layer 617. The gate electrode 618 may be formed of multiple layers or a single layer of gold (Au), silver (Ag), copper (Cu), Ni, platinum (Pt), palladium (Pd), aluminum (Al), molybdenum (Mo), or chromium (Cr) or may include an alloy such as an Al:Nd (neodymium) alloy or an Mo:W (tungsten) alloy.

An interlayer insulating layer 619 may be formed on the gate electrode 618. The interlayer insulating layer 619 may be formed of an insulating material such as a silicon oxide or a silicon nitride. In an embodiment, the interlayer insulating layer 619 may be formed of an insulating organic material.

A source electrode 620 and a drain electrode 621 may be formed on the interlayer insulating layer 619. A contact hole may be formed in the gate insulating layer 617 and the interlayer insulating layer 619 by removing a portion thereof, the source electrode 620 may be electrically connected to the source region 614 through the contact hole, and the drain electrode 621 may be electrically connected to the drain region 615 through the contact hole.

A passivation layer 622 may be formed on the source electrode 620 and the drain electrode 621. The passivation layer 622 may be formed of an organic material or an inorganic material such as a silicon oxide or a silicon nitride.

A planarization layer 623 may be formed on the passivation layer 622. The planarization layer 623 may include an organic material such as acryl, polyimide, or benzocyclobutene (BCB).

The organic light-emitting device (OLED) may be formed on the thin film transistor TFT.

The organic light-emitting device (OLED) may include a first electrode 625, a second electrode 627, and an intermediate layer 626 that is interposed between the first electrode 625 and the second electrode 627.

The first electrode 625 may be electrically connected to any one of the source electrode 620 and the drain electrode 621 through a contact hole. The first electrode 625 may be a pixel electrode.

The first electrode 625 may function as an anode and may be formed of various conductive materials. The first electrode 625 may be formed as a transparent electrode or a reflective electrode.

For example, the first electrode 625 may be a transparent electrode, and the first electrode 625 may include ITO, IZO, ZnO, or In$_2$O$_3$. The first electrode 625 may be a reflective electrode, and the first electrode 625 may be formed by forming a reflective layer of Ag, Mg, Al, Pt, Pd, Au, Ni, Nd, Ir, Cr, or any combination thereof and forming ITO, IZO, ZnO, or In$_2$O$_3$ on the reflective layer.

A pixel definition layer (PDL) 624 may be formed on the planarization layer 623 to cover an edge of the first electrode 625. The pixel definition layer 624 may surround the edge of the first electrode 625, and may define a light-emitting region of each subpixel.

The pixel definition layer 624 may be formed of an organic material or an inorganic material.

For example, the pixel definition layer 624 may be formed of an organic material such as polyimide, polyamide, benzocyclobutene, acryl resin, or phenol resin, or an inorganic material such as SiN$_x$. The pixel definition layer 624 may be a single layer or formed of multiple layers.

The intermediate layer 626 may be formed on the first electrode 625 in a region that may be exposed by etching a portion of the pixel definition layer 624. The intermediate layer 626 may be formed by deposition.

The intermediate layer 626 may be formed of a low-molecular organic material or a high-molecular organic material.

The intermediate layer 626 may include an organic emission layer (EML). As another example, the intermediate layer 626 includes, for example, an organic emission layer and may further include at least one of a hole injection layer (HIL), a hole transport layer (HTL), an electron transport layer (ETL), and an electron injection layer (EIL). In an embodiment, the intermediate layer 626 may include an organic emission layer and may further include other various functional layers.

The second electrode 627 may be formed on the intermediate layer 626. The second electrode 627 may correspond to a common electrode. Like the first electrode 625, the second electrode 627 may be formed as a transparent electrode or a reflective electrode.

The first electrode 625 may be formed as a transparent electrode or a reflective electrode, and may be formed to have a shape corresponding to an opening of each subpixel. The second electrode 627 may be deposited on an entire surface of a display unit as a transparent electrode or a reflective electrode. In an embodiment, the second electrode 627 may be formed in a predetermined pattern instead of being deposited on the entire surface. The first electrode 625 and the second electrode 627 may be deposited at opposite positions.

The first electrode 625 and the second electrode 627 may be insulated from each other by the intermediate layer 626. When a voltage is applied to the first electrode 625 and the second electrode 627, visible light is emitted from the intermediate layer 626 and an image, for example, one that is recognizable by a user, is formed.

An encapsulation substrate 640 may be formed on the organic light-emitting device (OLED). The encapsulation substrate 640 may protect the intermediate layer 626 or other thin films from external moisture or oxygen.

The encapsulation substrate 640 may include a stack of one or more organic or inorganic layers. For example, the encapsulation substrate 640 may include a stack of one or more organic layers 641 and 642, such as epoxy, polyimide, polyethylene terephthalate, polycarbonate, polyethylene, and polyacrylate, and one or more inorganic layers 643, 644, and 645, such as a silicon oxide (SiO$_2$), a silicon nitride (SiN$_x$), an aluminum oxide (Al$_2$O$_3$), a titanium oxide (TiO$_2$), a zirconium oxide (ZrO$_x$), and a zinc oxide (ZnO).

The encapsulation substrate 640 may include one or more organic layers 641 and 642 and two or more inorganic layers 643, 644, and 645. The top layer 645 of the encapsulation substrate 640, which may be exposed to the outside, may be formed of an inorganic layer, and may prevent intrusion of moisture into the organic light-emitting device (OLED).

As described above, according to the one or more of the above embodiments, in the mask frame assembly for thin film deposition, a foreign substance remaining on the support may be removed via the patterned portion, and a defect in the close adhesion of the mask to the support may be minimized.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A mask frame assembly for thin film deposition, the mask frame assembly comprising:
   a mask frame having an opening surrounded by the mask frame; and
   a support extending in a second direction across the opening to support a mask on the mask frame,
   the support including:
   a support body,
   a plurality of ribs in the support body, and
   a plurality of patterned portions arranged along a first direction orthogonal to the second direction in spaces between the plurality of ribs, each of the patterned portions having a different thickness than a thickness of the ribs and extending further along the second direction than in the first direction in a stripe pattern,
   wherein the plurality of patterned portions are spaced apart from each other within the support body along the first direction, and each of the patterned portions extending continuously within the support body in the second direction.

2. The mask frame assembly as claimed in claim 1, wherein the mask includes one or more mask sticks extending across the opening in the first direction, and the support extends in the second direction intersecting the one or more mask sticks.

3. The mask frame assembly as claimed in claim 2, wherein the support is between the mask and the mask frame, and both end portions of the support body are attached to a topmost surface of the mask frame via welding points.

4. The mask frame assembly as claimed in claim 2, wherein a portion of the support body has a smaller thickness than the plurality of ribs.

5. The mask frame assembly as claimed in claim 1, wherein:
   the mask frame assembly includes a plurality of supports spaced apart from each other along the first direction, and each one of the supports includes the plurality of patterned portions spaced apart from each other along the first direction, and
   each one of the patterned portions extends continuously in the second direction between a pair of ribs adjacent to each other along the first direction, the patterned portions being regions of smaller thickness than the ribs.

6. The mask frame assembly as claimed in claim 1, wherein the plurality of patterned portions are grooves in the support body, the grooves extending to a depth that is smaller than a thickness of the ribs, and the grooves extending continuously along a majority of a length of the support body.

7. The mask frame assembly as claimed in claim 5, wherein the plurality of patterned portions are regions of half thickness compared to the ribs.

8. The mask frame assembly as claimed in claim 4, wherein the patterned portions include a first patterned portion having a first region of smaller thickness than the ribs at a center of the support body along the second direction and a second patterned portion having a second first region of smaller thickness than the ribs at both edges of the support body along the first direction.

9. The mask frame assembly as claimed in claim 8, wherein the first region of smaller thickness than the ribs extends to the support body along the second direction, and a plurality of protrusions are in the first region of smaller thickness than the ribs.

10. The mask frame assembly as claimed in claim 9, wherein, in a portion of the support body including the plurality of protrusions, a thickness of the support body is equal to a thickness of the plurality of ribs.

11. The mask frame assembly as claimed in claim 8, wherein the second patterned portion is between a pair of adjacent ribs along the first direction and extends to the support body along the second direction.

12. The mask frame assembly as claimed in claim 8, wherein the first patterned portion having the first region of smaller thickness than the ribs and the second patterned portion having the second region of smaller thickness than the ribs are etched toward a bottom surface of the support body from a top surface of the support body that faces the mask.

13. The mask frame assembly as claimed in claim 2, wherein the plurality of patterned portions pass through the support body.

14. The mask frame assembly as claimed in claim 13, wherein the plurality of patterned portions are between a pair of adjacent ribs along the first direction and are through holes that extend in the support body along the second direction and pass through the support body.

15. The mask frame assembly as claimed in claim 2, wherein a bottom surface of the mask directly contacts a top surface of the plurality of ribs.

16. The mask frame assembly as claimed in claim 2, wherein a plurality of deposition pattern portions are in the one or more mask sticks along the first direction to be spaced apart from each other, and a mask rib is between adjacent deposition pattern portions to connect the adjacent deposition pattern portions to each other.

17. The mask frame assembly as claimed in claim 16, wherein the support is at a position corresponding to the mask rib.

18. The mask frame assembly as claimed in claim 2, wherein the first direction is a direction in which a tensile force to weld both end portions of the mask to the mask frame is applied to the mask, and the second direction is a direction in which a tensile force to weld both end portions of the support to the mask frame is applied to the support.

19. The mask frame assembly as claimed in claim 18, wherein the first direction is a width direction of the support, and the second direction is a longitudinal direction of the support.

20. The mask frame assembly as claimed in claim 1, wherein the mask frame includes a plurality of first frames facing each other in the first direction and a plurality of second frames facing each other in the second direction, and the plurality of first frames and the plurality of second frames are connected to each other to surround the opening.

* * * * *